United States Patent
Kristal

(10) Patent No.: US 11,404,658 B2
(45) Date of Patent: Aug. 2, 2022

(54) LIGHT EMITTING LAYER, MANUFACTURING METHOD THEREOF, AND DISPLAY APPARATUS

(71) Applicant: BOE TECHNOLOGY GROUP CO., LTD., Beijing (CN)

(72) Inventor: Boris Kristal, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 312 days.

(21) Appl. No.: 16/618,441

(22) PCT Filed: Jan. 16, 2019

(86) PCT No.: PCT/CN2019/071873
§ 371 (c)(1),
(2) Date: Dec. 2, 2019

(87) PCT Pub. No.: WO2020/147026
PCT Pub. Date: Jul. 23, 2020

(65) Prior Publication Data
US 2021/0408423 A1   Dec. 30, 2021

(51) Int. Cl.
*H01L 33/16* (2010.01)
*H01L 51/50* (2006.01)
*H01L 51/00* (2006.01)
*H01L 51/56* (2006.01)

(52) U.S. Cl.
CPC ...... *H01L 51/5032* (2013.01); *H01L 51/0004* (2013.01); *H01L 51/0077* (2013.01); *H01L 51/56* (2013.01)

(58) Field of Classification Search
CPC .......... H01L 33/16; H01L 33/18; H01L 33/26
See application file for complete search history.

(56) References Cited

U.S. PATENT DOCUMENTS

| | | | |
|---|---|---|---|
| 10,263,207 B2 | 4/2019 | Lee et al. | |
| 2018/0151812 A1* | 5/2018 | Peng | H01L 51/0077 |
| 2019/0157352 A1* | 5/2019 | Li | H01L 51/524 |
| 2020/0052154 A1* | 2/2020 | Zhang | H01L 51/502 |

FOREIGN PATENT DOCUMENTS

| | | |
|---|---|---|
| CN | 105206718 A | 12/2015 |
| CN | 105679807 A | 6/2016 |
| CN | 107210366 A | 9/2017 |

OTHER PUBLICATIONS

International Search Report dated Oct. 24, 2019, issued in counterpart application No. PCT/CN2019/071873 (9 pages).

* cited by examiner

Primary Examiner — Jae Lee
(74) Attorney, Agent, or Firm — WHDA, LLP

(57) ABSTRACT

The present disclosure is related to a method of manufacturing a light-emitting layer. The method of manufacturing a light-emitting layer may include forming a layer of metal first halide perovskite on a substrate, forming a first pattern comprising metal second halide perovskite in the layer of metal first halide perovskite, and forming a second pattern comprising metal third halide perovskite in the layer of metal first halide perovskite.

19 Claims, 5 Drawing Sheets

LIGHT EMITTING LAYER, MANUFACTURING METHOD THEREOF, AND DISPLAY APPARATUS

TECHNICAL FIELD

This disclosure relates to display technology, in particular, to a light emitting layer, a method of forming the light emitting layer and a display apparatus including the light emitting layer.

BACKGROUND

A new emerging class of the electronic materials gathering more and more interest is an all-inorganic or hybrid organic-inorganic metal halide perovskite materials. In recent years they have been mainly utilized in solar cells with a great measure of success, but now they are receiving a great deal of attention for application as a light-emitting material in perovskite electro-luminescent devices (Pellets). In these devices perovskites are being directly injected with electrons and holes to exhibit electroluminescence. Such displays are especially promising for battery-powered, portable electronic devices, including smartphones, tablets, handheld personal computers, computer monitors, etc. These applications call for displays with high information content, full color, and fast video rate response time in addition to low power consumption.

BRIEF SUMMARY

Accordingly, one example of the present disclosure is a method of preparing a light-emitting layer. The method of preparing the light-emitting layer may include forming a layer of metal first halide perovskite on a substrate, forming a first pattern comprising metal second halide perovskite in the layer of metal first halide perovskite, and forming a second pattern comprising metal third halide perovskite in the layer of metal first halide perovskite.

Another example of the present disclosure is a metal halide perovskite light emitting display apparatus comprising the light emitting layer formed according to one embodiment of the present disclosure.

Another example of the present disclosure is a display apparatus. The display apparatus may include a light emitting layer. The light emitting layer may include a first pattern comprising metal second halide perovskite; a second pattern comprising metal third halide perovskite; and a third pattern comprising metal first halide perovskite. There is no bank or low bank among the first pattern, the second pattern, and the third pattern.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the disclosure are apparent from the following detailed description taken in conjunction with the accompanying drawings in which:

DETAILED DESCRIPTION

Figure 1:
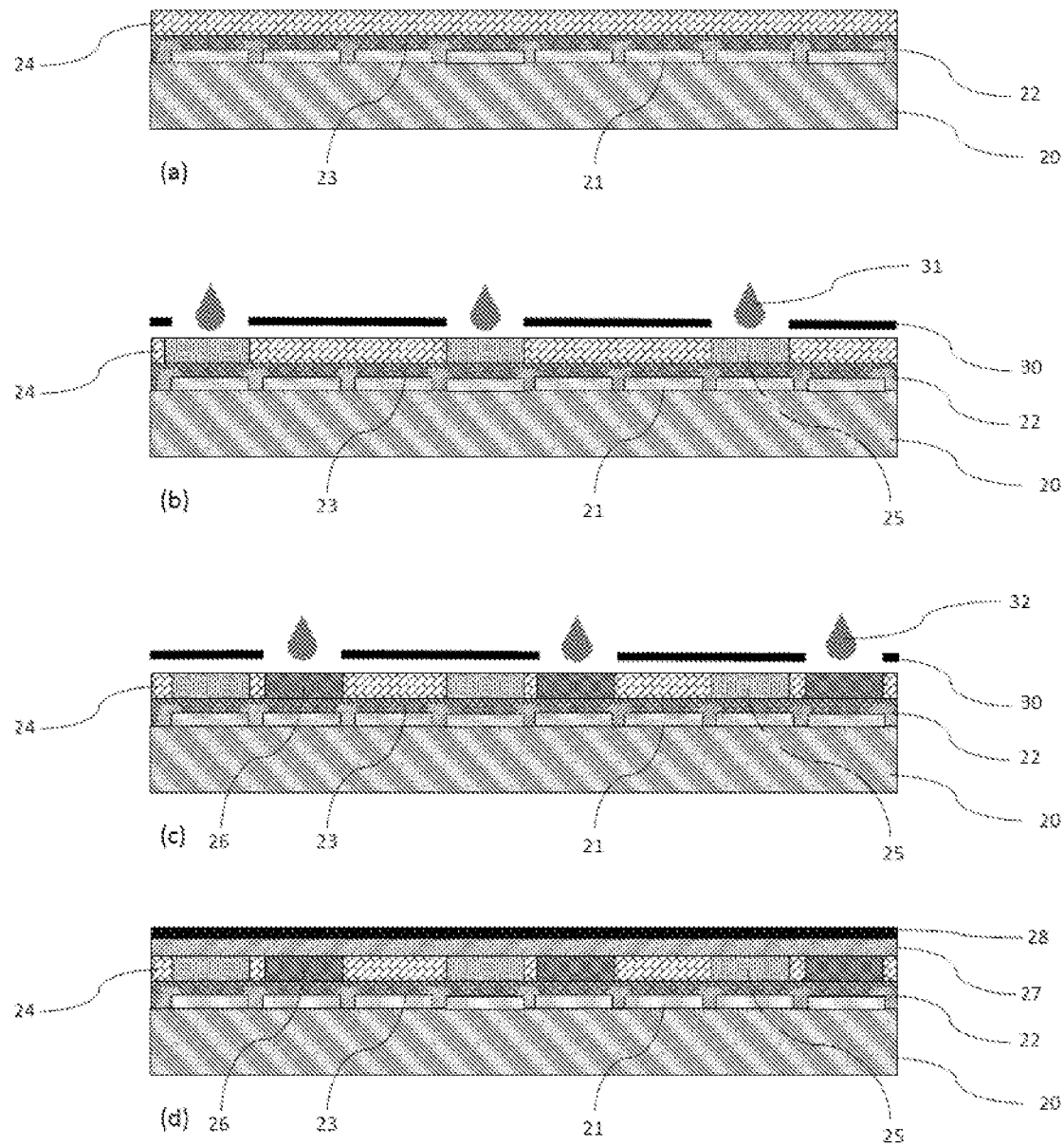
FIG. 1 schematically illustrates a method of preparing a light-emitting layer according to one embodiment of the present disclosure.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-5. When referring to the figures, like structures and elements shown throughout are indicated with like reference numerals.

In this specification, the terms "first," "second." etc. may be added as prefixes. These prefixes, however, are only added in order to distinguish the terms and do not have specific meaning such as order and relative merits. In the description of the present disclosure, the meaning of "plural" is two or more unless otherwise specifically defined.

In the description of the specification, references made to the term "some embodiments," "one embodiment," "exemplary embodiments," "example," "specific example," "some examples" and the like are intended to refer that specific features, structures, materials or characteristics described in connection with the embodiment or example are included in at least some embodiments or examples of the present disclosure. The schematic expression of the terms does not necessarily refer to the same embodiment or example. Moreover, the specific features, structures, materials or characteristics described may be included in any suitable manner in any one or more embodiments or examples.

A number modified by "about" herein means that the number can vary by 10% thereof.

The production of full-color PeLEDs is directed toward the development of cost-effective, high throughput process for production color pixels with high uniformity and reproducibility. For the manufacture of the monochromatic displays by liquid processing, spin-coating process and slot coating process can be used with good results. However, manufacture of full-color displays requires certain modifications to the procedures used in manufacture of monochromatic displays. For example, to make a display with full-color images, each display pixel is divided into three subpixels, each emitting one of the three primary display colors, red green and blue. The division of full-color pixels into three subpixels has resulted in a need to modify current process to prevent the spreading of the liquid colored materials (i.e. inks) and color mixing.

Several methods for providing ink containment am described in the literature. These are based on containment structures, surface tension discontinuities, and combinations of both. Containment structures are geometric obstacles to spreading: pixel wells, banks, etc. In order to be effective these structures must be large, comparable to the wet thickness of the deposited materials. When the emissive ink is printed into these structures it wets onto the structure surface, so thickness uniformity is reduced near the structure. Therefore the structure must be moved outside the emissive "pixel" region so the non-uniformities are not visible in operation.

Due to limited space on the display substrate, especially the high-resolution display substrate, presence of containment structures on the display substrate reduces the available emissive area of the pixel. Practical containment structures generally have a negative impact on quality when depositing continuous layers of the charge injection and transport layers. Consequently, all the layers must be printed, thereby making the process of display fabrication slower, more expensive and further reducing active layer thickness uniformity between the pixels.

Accordingly, one exemplary embodiment of the present disclosure provides a method of forming a metal halide perovskite emitting pattern of a perovskite electro-luminescence display substrate. The method may include a substrate preparation step, a first functional layers deposition step, a metal bromide perovskite layer fabrication step, a first halide conversion step, a second halide conversion step, a second functional layers deposition step, and a second electrode deposition step. In one embodiment, during the substrate preparation step, a substrate in which the regions for emitting different colors are defined may be prepared. During the first functional layers deposition step, charge injecting and conducting materials are deposited onto the substrate, without patterning, utilizing any of commonly used deposition methods such as ink jet printing, nozzle printing, offset printing, slot-coating, spraying, thermal evaporation, or other. During the metal bromide perovskite layer fabrication step, a continuous emissive layer of all inorganic or a hybrid organic-inorganic metal bromide perovskite is formed on the top of the functional layers. During the first halide conversion step, the bromine in the metal bromide perovskite layer is being partially or completely substituted by iodine in a predetermined pattern through the use of screen printing or similar technique. A benzoyl iodide solution in an organic solvent may be used as a halide conversion agent. The organic solvent may be toluene, xylene, cyclohexane, and benzene. In one embodiment, the halide conversion agent is a benzoyl iodide solution in toluene. During the second halide conversion step, the bromine in the metal bromide perovskite layer is being partially or completely substituted by chlorine in the predetermined pattern through the use of screen printing or similar technique. A benzoyl chloride solution in an organic solvent may be used as a halide conversion agent. The organic solvent may be toluene, xylene, cyclohexane, and benzene. In one embodiment, the halide conversion agent is a benzoyl chloride solution in toluene. During the second functional layers deposition step, charge injecting and conducting materials for charges opposite to the ones in the first functional layers are deposited utilizing any of commonly used deposition methods. During the second electrode deposition step, a metal electrode may be deposited onto the second functional layers using a vacuum deposition method.

In some embodiments, the method of preparing the light-emitting layer may include forming a layer of metal first halide perovskite on a substrate, forming a first pattern comprising metal second halide perovskite in the layer of metal first halide perovskite, and forming a second pattern comprising metal third halide perovskite in the layer of metal first halide perovskite. The first halide is bromide, the second halide is iodide, and the third halide is chloride.

Furthermore, forming the first pattern comprising metal second halide perovskite in the layer of metal first halide perovskite may include depositing a solution comprising iodide in a first region on the layer of metal first halide perovskite and performing a first halide conversion to exchange the bromide in the layer of metal first halide perovskite where the first pattern is formed with the iodide in the solution comprising iodide partially or completely. Orthographic projection of the first region on the substrate may substantially coincide with orthographic projection of the first pattern on the substrate. The solution comprising iodide may be benzoyl iodide solution in an organic solvent such as toluene. The solution comprising iodide may have a viscosity in a range of about 0.5-10 mPa·s. The concentration of benzoyl iodide solution may be in a range of 0.05-0.25 mol/L, preferably in the range of 0.1-0.15 mol/L. In one embodiment, the concentration of benzoyl iodide solution is 0.12 mol/L. Depositing the solution comprising iodide in the first region on the layer of metal first halide perovskite may be performed by a screen printing technique using a first screen.

Similarly, forming the second pattern comprising metal third halide perovskite in the layer of metal first halide perovskite may include depositing a solution comprising chloride in a second region on the layer of metal first halide perovskite and performing a second halide conversion to exchange the bromide in the layer of metal first halide perovskite where the second pattern is formed with the chloride in the solution comprising chloride partially or completely. Orthographic projection of the second region on the substrate may substantially coincide with orthographic projection of the second pattern on the substrate. The solution comprising chloride may be benzoyl chloride solution in an organic solvent such as toluene. The solution comprising chloride may have a viscosity in a range of about 0.5-10 mPa·s. The concentration of benzoyl chloride solution may be in a range of 0.05-0.25 mol/L, preferably in the range of 0.1-0.15 mol/L. In one embodiment, the concentration of benzoyl chloride solution is 0.12 mol/L. Depositing the solution comprising chloride in the second region on the layer of metal first halide perovskite may be performed by a screen printing technique using a second screen. The above method of preparing the light-emitting layer according to one embodiment of the present disclosure is further described in detail in reference with FIG. 1.

FIG. 1 schematically illustrates a method of preparing a light-emitting layer according to one embodiment of the present disclosure. In one embodiment, as shown in (a) of FIG. 1, the method of preparing the light-emitting layer includes a metal bromide perovskite layer fabrication step. In the metal bromide perovskite layer fabrication step, a continuous emissive layer with green emission wavelength of all inorganic or a hybrid organic-inorganic metal bromide perovskite 24 is formed on top of a first functional layer 23. The first functional layer 23 may include a plurality of functional layers. The first functional layer is fabricated on a prepared substrate comprising a substrate layer 20, patterned electrodes 21, and pixel defining structures or banks 22.

In one embodiment, as shown in (b) of FIG. 1, the method of preparing the light-emitting layer further includes a first halide conversion step. During the first halide conversion step, the bromine in the metal bromide perovskite layer 24 is being partially or completely substituted by iodine in the predetermined pattern through the use of screen printing or similar technique through a screen 30 utilizing benzoyl iodide solution in toluene 31 as a halide conversion agent. As such, a pattern 25 of metal iodide or metal bromide/iodide (depending on the desired depth of color) perovskite, characterized by red emission wavelength, is formed within the metal bromide perovskite layer 24.

In one embodiment, as shown in (c) of FIG. 1, the method of preparing the light-emitting layer further includes a second halide conversion step. During the second halide conversion step, the bromine in the metal bromide perovskite layer 24 is being partially or completely substituted by chlorine in the predetermined pattern through the use of screen printing or similar technique through a screen 30 utilizing benzoyl chloride solution in toluene 32 as a halide conversion agent. As such, a pattern 26 of metal chloride or metal chloride/bromide (depending on the desired depth of color) perovskite, characterized by blue emission wavelength, is formed within the metal bromide perovskite layer 24.

In one embodiment, as shown in (d) of FIG. 1, the method of preparing the light-emitting layer further includes a second functional layers deposition step and a second electrode deposition step. During the second functional layers deposition step, charge injecting and conducting materials for charges opposite to the ones in the first functional layer 23 are deposited utilizing any of commonly used deposition methods to form a second functional layer 27. During the second electrode deposition step, a non-patterned metal electrode 28 is deposited on the second functional layer 27 using a vacuum deposition method.

In this embodiment, after a metal halide perovskite layer is formed, halide conversion steps are performed as described in the exemplary embodiments of the present disclosure. Due to efficiency of a halide exchange reaction between a metal halide perovskite and a benzoyl halide precursor, it is possible to have a complete or partial substitution (depending on the stoichiometric ratio) of a halogen in a metal halide perovskite by another halogen if a benzoyl halide precursor in toluene solution is added. Such halogen exchange reaction doesn't affect perovskite crystalline structure, and accordingly a parent cubic crystalline structure is retained. Using screen printing or similar technique, a benzoyl halide precursor can be applied only to designated areas of the metal halide perovskite layer, thereby creating small local areas with different halide composition compared to parent composition. By controlling the ratio of Cl/Br and Br/I in the metal halide perovskites, one can continuously tune the emission wavelength between 410 and 700 nm.

Another example of the present disclosure provides a method of forming a metal halide perovskite emitting pattern of a perovskite electro-luminescence display, using a gaseous phase halogen exchange process. This embodiment may adopt the previous exemplary embodiment in the substrate preparation step, the first functional layers deposition step, the second functional layers deposition step and the second electrode deposition step. It differs from the previous exemplary embodiment in the metal halide perovskite fabrication step, where instead of a metal bromide perovskite, a metal iodide perovskite is formed as a continuous emissive layer on top of the functional layers. This step is followed by a first halide conversion step, where the iodine in the metal iodide perovskite layer is being partially or completely substituted by bromine in the predetermined pattern through the use of a bromine gas ($Br_2$) applied through a stencil or by micro-nozzle. This step is further followed by a second halide conversion step, where the iodine in the metal iodide perovskite layer is being partially or completely substituted by chlorine in the predetermined pattern through the use of a chlorine gas ($Cl_2$) applied through a stencil or by micro-nozzle. During the gaseous phase halogen exchange process, the gas is controlled by the design of micro-nozzle that dispenses the gas. The halogen gas delivery rate and nozzle proximity to the substrate can limit exposure of surrounding areas. In addition, some kind of masking can be used to protect surrounding area. This masking can be a part of delivery system or can be a separate element applied to the substrate before the exposure.

In some embodiments, the method of preparing the light-emitting layer may include forming a layer of metal first halide perovskite on a substrate, forming a first pattern comprising metal second halide perovskite in the layer of metal first halide perovskite, and forming a second pattern comprising metal third halide perovskite in the layer of metal first halide perovskite. The first halide is iodide, the second halide is bromide, and the third halide is chloride.

Forming the first pattern comprising metal second halide perovskite in the layer of metal first halide perovskite may include applying a first gas comprising bromine in a first region on the layer of metal first halide perovskite to perform a first halide conversion. Orthographic projection of the first region on the substrate substantially may coincide with orthographic projection of the first pattern on the substrate. The iodide in the layer of metal first halide perovskite where the first pattern is formed may be exchanged with the bromine in the first gas to form the first pattern comprising metal second halide perovskite.

Furthermore, forming the second pattern comprising metal third halide perovskite in the layer of metal first halide perovskite may include applying a second gas comprising chlorine in a second region on the layer of metal first halide perovskite to perform a second halide conversion. Orthographic projection of the second region on the substrate may substantially coincide with orthographic projection of the second pattern on the substrate. The iodide in the layer of metal first halide perovskite where the second pattern is formed may be exchanged with the chlorine in the second gas to form the second pattern comprising metal third halide perovskite. The second gas comprising chlorine may be a chlorine gas or a mixture of chlorine and bromine gases. The above method of preparing the light-emitting layer according to one embodiment of the present disclosure is further described in detail in reference with FIG. 2.

Figure 2:
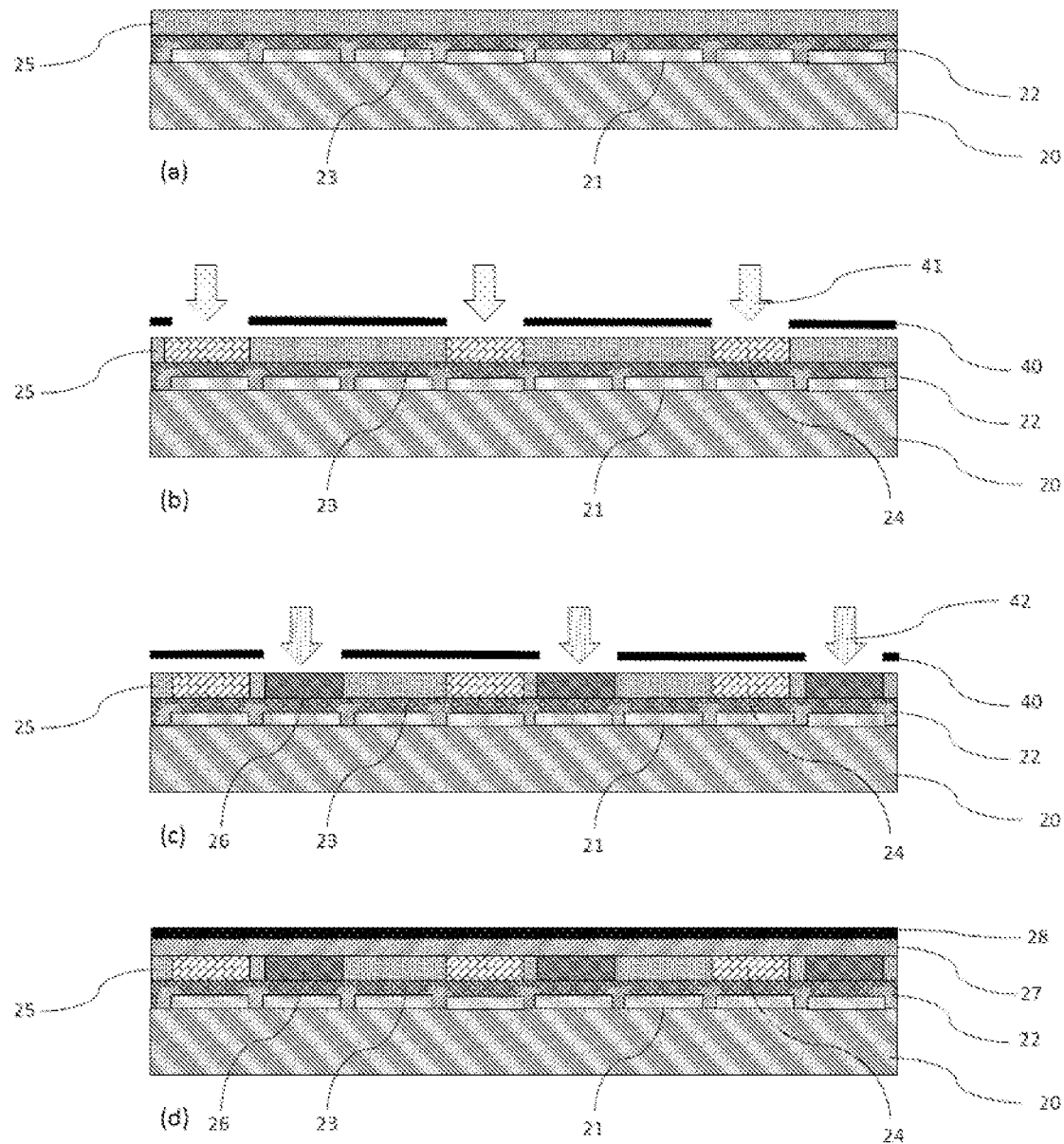
FIG. 2 illustrates a method of preparing a light-emitting layer according to one embodiment of the present disclosure.

FIG. 2 illustrates a method of preparing a light-emitting layer according to one embodiment of the present disclosure. In one embodiment, the method of preparing the light-emitting layer includes a metal iodide perovskite layer fabrication step. As shown in (a) of FIG. 2, during the metal iodide perovskite layer fabrication step, a continuous emissive layer with red emission wavelength of all inorganic or a hybrid organic-inorganic metal iodide perovskite 25 is formed on top of the first functional layer 23, which is fabricated on a prepared substrate comprising a substrate layer 20, patterned electrodes 21, and pixel defining structures or banks 22. The first functional layer 23 may include a plurality of functional layers.

In one embodiment, the method of preparing the light-emitting layer may further include a first halide conversion step. As shown in (b) of FIG. 2, during the first halide conversion step, the iodine in the metal iodide perovskite layer 25 is being partially or completely substituted by bromine in the predetermined pattern through the use of a bromine gas ($Br_2$) 41 applied through a stencil or by micro-nozzle 40. As such, a pattern 24 of metal bromide or metal bromide/iodide (depending on the desired depth of color) perovskite, characterized by green emission wavelength, is formed within the metal iodide perovskite layer 25.

In one embodiment, the method of preparing the light-emitting layer may further include a second halide conversion step. As shown in (c) of FIG. 2, during the second halide conversion step, the iodine in the metal iodide perovskite layer 25 is being partially or completely substituted by chlorine in the predetermined pattern through the use of a chlorine gas ($Cl_2$) or a mixture of chlorine and bromine gases 42 applied through a stencil or by micro-nozzle 40. As such, a pattern 26 of metal chloride or metal chloride/bromide (depending on the desired depth of color) perovskite, characterized by blue emission wavelength, is formed within the metal iodide perovskite layer 25.

In one embodiment, the method of preparing the light-emitting layer may further include a second functional layers deposition step and a second electrode deposition step. As shown in (d) of FIG. 2, during the second functional layers deposition step, charge injecting and conducting materials for charges opposite to the ones in the first functional layer 23 are deposited utilizing any of commonly used deposition methods to form a second functional layer 27. During the second electrode deposition step, a non-patterned metal electrode 28 is deposited on the second functional layer 27 using a vacuum deposition method.

In this embodiment, halide conversion steps can be performed using gaseous halide conversion agents. In this case, a metal halide perovskite layer before halide conversion would consist of a monovalent metal or isovalent organic cation A, a divalent metal cation B and an iodine anion. The halide conversion steps can be performed by exposing the areas of the metal halide perovskite layer designated for halogen conversion to small streams of halogen gas using micro-nozzles or a stencil. The ratio of the halogen anions and therefore the emitted light wavelength in the post-conversion perovskites can be controlled by the gaseous stream speed and the time of exposure.

Another example of the present disclosure provides a method of forming a metal halide perovskite emitting pattern of a perovskite electro-luminescence display, using X-ray or e-beam lithography. This embodiment may adopt the previous embodiments in the substrate preparation step, the first functional layers deposition step, the metal iodide perovskite layer fabrication step, the second functional layers deposition step, and the second electrode deposition step. The difference is that the metal iodide perovskite layer fabrication step is followed by a first X-ray or e-beam irradiation step, where the metal iodide perovskite layer is exposed to a short X-ray irradiation through a photo-mask to create a third pattern. This step is followed by a first halide conversion step, where the iodine in the metal bromide perovskite layer in the areas unexposed to X-ray irradiation is being partially or completely substituted by bromine through the exposure to the bromine gas ($Br_2$). This step is further followed by a second X-ray or e-beam irradiation step, where the metal bromide perovskite layer is exposed to a short X-ray irradiation through a photo-mask to create a first pattern. This step is followed by a second halide conversion step, where the bromine in the metal bromide perovskite layer in the areas unexposed to X-ray or e-beam irradiation is being partially or completely substituted by chlorine through the exposure to the chlorine gas ($Cl_2$). This step may be or may not be followed by the exposure of the metal chloride perovskite areas to X-ray or e-beam irradiation to improve metal chloride perovskite stability, similar to the metal bromide and metal iodide perovskites.

In some embodiments, the method of preparing the light-emitting layer may include forming a layer of metal first halide perovskite on a substrate, forming a first pattern comprising metal second halide perovskite in the layer of metal first halide perovskite, and forming a second pattern comprising metal third halide perovskite in the layer of metal first halide perovskite. The first halide is iodide, the second halide is bromide, and the third halide is chloride.

Forming the first pattern comprising metal second halide perovskite in the layer of metal first halide perovskite may include performing a first irradiation on a third region of the layer of metal first halide perovskite to form a third pattern comprising metal first halide perovskites with partially graphitized ligands in the layer of metal first halide perovskite. Then, a first gas comprising bromine is applied on the layer of metal first halide perovskite to perform a first halide conversion so that the iodide in the layer of metal first halide perovskite except the third pattern is exchanged with the bromine in the first gas partially or completely to form a layer of metal second halide perovskite. Then, a second irradiation is performed on a first region of the layer of metal second halide perovskite to form the first pattern comprising metal second halide perovskite with partially graphitized ligands in the layer of metal second halide perovskite. Orthographic projection of the third region on the substrate may substantially coincide with orthographic projection of the third pattern on the substrate. Orthographic projection of the first region on the substrate may substantially coincide with orthographic projection of the first pattern on the substrate.

Furthermore, forming the second pattern comprising metal third halide perovskite in the layer of metal first halide perovskite may include applying a second gas comprising chlorine on the layer of metal second halide perovskite to perform a second halide conversion. The bromide in the layer of metal second halide perovskite except the first pattern may be exchanged with the second gas to form the second pattern comprising metal third halide perovskite. The first irradiation may be an x-ray irradiation or an e-beam irradiation, and the second irradiation may be an x-ray irradiation or an e-beam irradiation.

Figure 3:
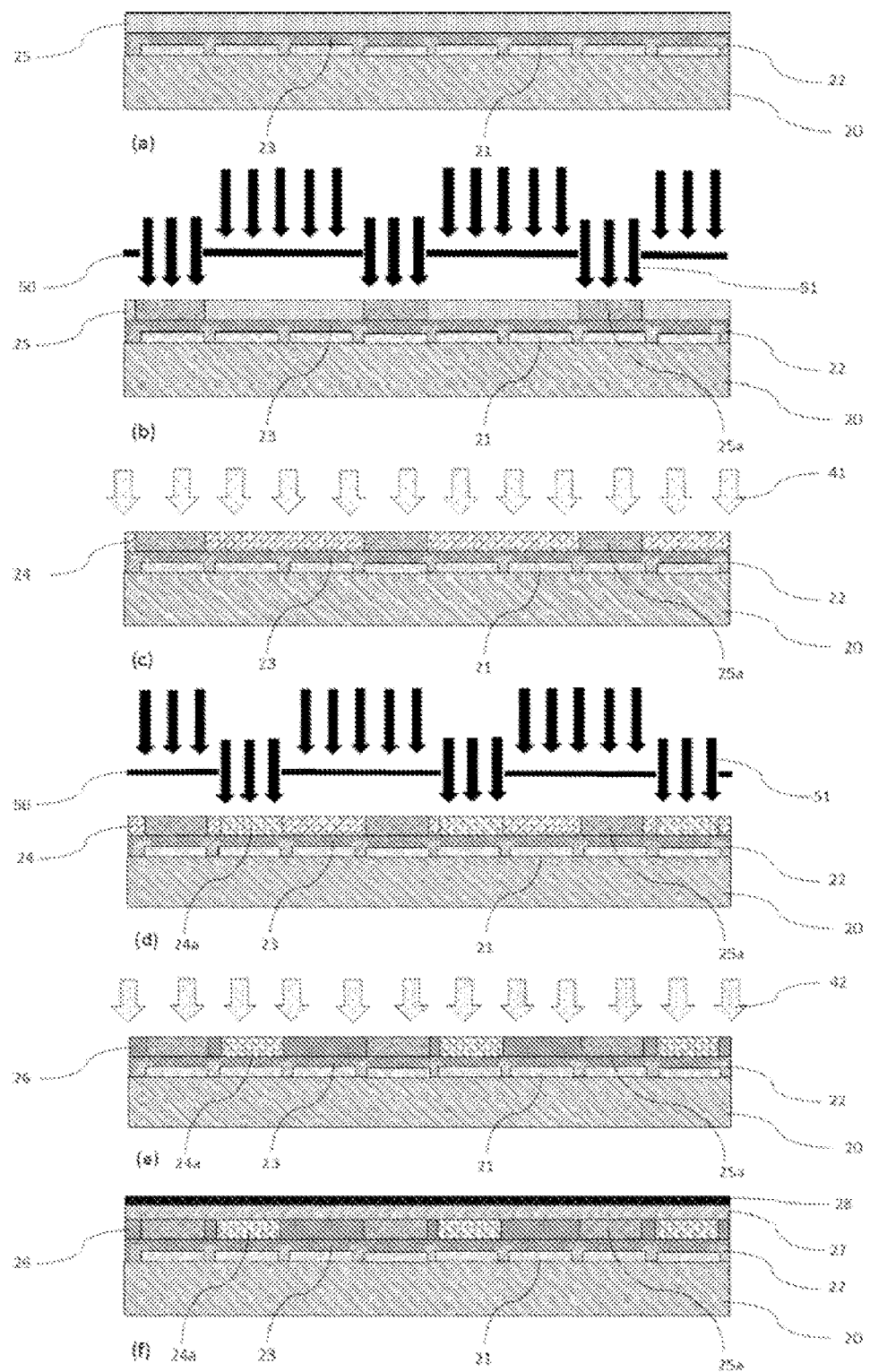
FIG. 3 illustrates a method of preparing a light-emitting layer according to one embodiment of the present disclosure.

The above method of preparing the light-emitting layer according to one embodiment of the present disclosure is further described in detail in reference with FIG. 3.

FIG. 3 illustrates a method of preparing a light-emitting layer according to one embodiment of the present disclosure. The method of preparing the light-emitting layer may include a metal iodide perovskite layer fabrication step. In one embodiment, as shown in (a) of FIG. 3, during the metal iodide perovskite layer fabrication step, a continuous emissive layer with red emission wavelength of all inorganic or a hybrid organic-inorganic metal iodide perovskite 25 is formed on top of the first functional layer 23, which is fabricated on a prepared substrate comprising a substrate layer 20, patterned electrodes 21, and pixel defining structures or banks 22.

In one embodiment, the method of preparing the light-emitting layer may further include a first X-ray or e-beam irradiation step. As shown in (b) of FIG. 3, during the first X-ray or e-beam irradiation step, the metal iodide perovskite layer 25 is exposed to a short X-ray or e-beam irradiation 51 through a photo-mask 50 to create a third pattern 25a of red-emitting metal iodide halide perovskites with partially graphitized ligands. Partial graphitization caused by irradiation in the metal iodide perovskite layer 25 results into ligands forming intermolecular C=C bonds. As a consequence adjacent nanocrystals are linked into a film.

In one embodiment, the method of preparing the light-emitting layer may further include a first halide conversion step. As shown in (c) of FIG. 3, during the first halide conversion step, the iodine in the unexposed areas to X-ray ore-beam irradiation of the metal iodide perovskite layer 25 is being partially or completely substituted by bromine through the use of a bromine gas (Br$_2$) 41 to form a metal bromide or metal bromide/iodide (depending on the desired color depth) perovskite 24 in the unexposed areas, characterized by green emission wavelength. The interlinked graphitized ligands create enough hindrance to prevent halogen gas from penetrating to the metal iodide perovskite layer 25 during the exposure period. Thus, the areas that weren't exposed to irradiation are converted, while those exposed are not.

In one embodiment, the method of preparing the light-emitting layer may further include a second X-ray or e-beam irradiation step. As shown in (d) of FIG. 3, during the second X-ray or e-beam irradiation step, the metal bromide perovskite layer 24 is exposed to a short X-ray or e-beam irradiation 51 through a photo-mask 50 to create a pattern 24a of green-emitting metal bromide or metal bromide/iodide perovskite with partially graphitized ligands.

In one embodiment, the method of preparing the light-emitting layer may further include a second halide conversion step. As shown in (e) of FIG. 3, during the second halide conversion step, the bromine in the unexposed areas to X-ray or e-beam irradiation of the metal bromide perovskite layer 24 is being partially or completely substituted by chlorine through the use of a chlorine gas (Cl$_2$) 42 to form a metal chloride or metal chloride/bromide (depending on the desired depth of color) perovskite 26 in the unexposed areas, characterized by blue emission wavelength. This step may be or may not be followed by another exposure to the X-ray or e-beam irradiation to graphitize the ligands in the blue-emitting metal chloride or metal chloride/bromide perovskite to make it more stable, similar to the previous steps.

In one embodiment, the method of preparing the light-emitting layer may further include a second functional layers deposition step and a second electrode deposition step. As shown in (f) of FIG. 3, during the second functional layers deposition step, charge injecting and conducting materials for charges opposite to the ones in the first functional layer 23 are deposited utilizing any of commonly used deposition methods to form a second functional layer 27. During the second electrode deposition step, a non-patterned metal electrode 28 is deposited on the second functional layer 27 using a vacuum deposition method. In one embodiment, functional layers, such as a hole injection layer (HIL), a hole transporting layer (HTL) for normal device structure, or an electron transporting layer (ETL) for inverted device structure, may be formed on the substrate to constitute the second functional layer.

In this embodiment, halide conversion steps can be performed using X-ray or e-beam lithography. In this case, a metal halide perovskite layer before halide conversion would consist of a monovalent metal or isovalent organic cation A, a divalent metal cation B and an iodine anion. The metal halide perovskite layer is then exposed to X-ray or c-beam irradiation in vacuum for a short period of time such as from several seconds to several minutes through a photomask to cause a partial graphitization (C=C bonds formation) in ligands of the metal iodide perovskite in the areas corresponding to red subpixels. For X-ray irradiation, the photon flux may be in the range $1.2 \times 10^{11}$-$2.4 \times 10^{11}$ photons/mm$^2$·s. For e-beam irradiation, the exposure dose may be in the range of 0.7-1.4 mC/cm$^2$. This is followed by a first halide conversion step, by exposing the entire surface of the metal halide perovskite layer to the bromine gas (Br$_2$), thereby resulting in complete or partial exchange of the iodine in the perovskite areas unexposed to the X-ray or c-beam irradiation by bromine. This step is further followed by a second X-ray or e-beam irradiation in vacuum through a photomask to cause a partial graphitization (C=C bonds formation) in ligands of the metal bromide perovskite in the areas corresponding to green subpixels. This is further followed by a second halide conversion step, by exposing the entire surface of the metal halide perovskite layer to the chlorine gas (Cl$_2$), thereby resulting in complete or partial exchange of the bromine in the perovskite areas unexposed to the X-ray or e-beam irradiation by chlorine.

The substrate may be prepared in a usual fashion used in organic electro-luminescent display fabrication or in hybrid organic/inorganic electro-luminescent display fabrication and can be of active-matrix or passive-matrix type. Functional layers, such as a hole injection layer (HIL), a hole transporting layer (HTL) for normal device structure, or an electron transporting layer (ETL) for inverted device structure, may be formed on the substrate to constitute the first functional layer prior to the metal halide perovskite material deposition.

The substrate with low banks, which have a bank height equal or lower than 500 nm, or no banks resulting into a flatter relief is preferred. A hole injection layer (HIL) and a hole transporting layer (HTL) for normal device structure, or an electron transporting layer (ETL) may be formed via a solution process such as slot-coating, spin-coating, ink-jet printing, or nozzle printing or via an evaporation process.

Figure 4:
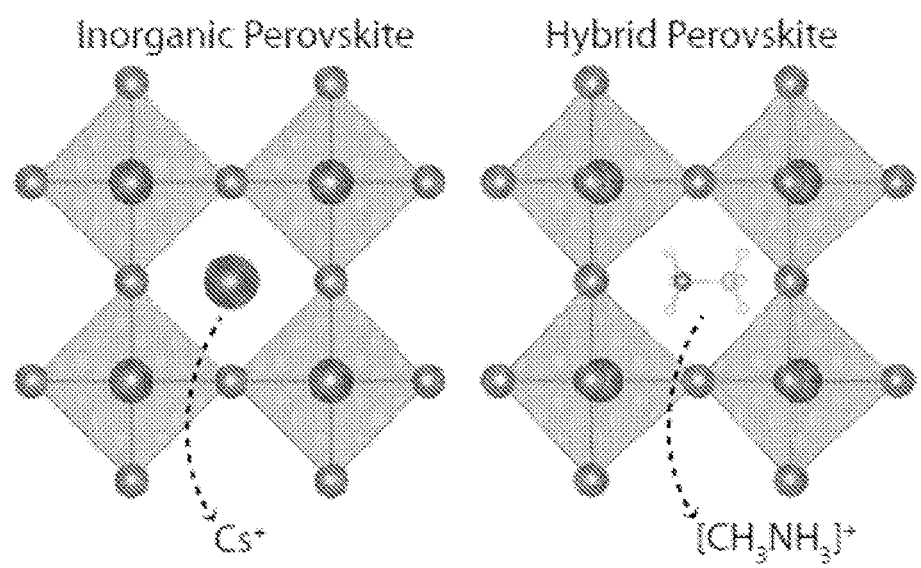
FIG. 4 shows crystal structure of the all-inorganic metal halide perovskite (left) and hybrid organic-inorganic metal halide perovskite (right)

In some embodiments, the metal halide perovskite layer is fabricated on the prepared substrate after the first electrode and first functional layer have been formed. Metal halide perovskites are a class of materials with the general structure ABX$_3$. X is a halide anion (Cl$^-$, Br$^-$, or I$^-$). A and B are two cations of dissimilar size, with B being a divalent metal such as Pb, Sn, etc. and A being a monovalent metal such as Cs in all-inorganic metal halide perovskites or an isovalent organic cation such as NH$_4^+$, CH$_3$NH$_4^+$, or NH$_2$CH=NH$_2^+$ in hybrid organic-inorganic metal halide perovskites. FIG. 4 shows crystal structure of the all-inorganic metal halide perovskite (left) and hybrid organic-inorganic metal halide perovskite (right). As shown in FIG. 4, metal halide perovskites have a so called "perovskite" crystal structure—a cubic structure that has the B cation in 6-fold coordination, surrounded by an octahedron of anions, and the A cation in 12-fold cuboctahedral coordination.

Figure 5:
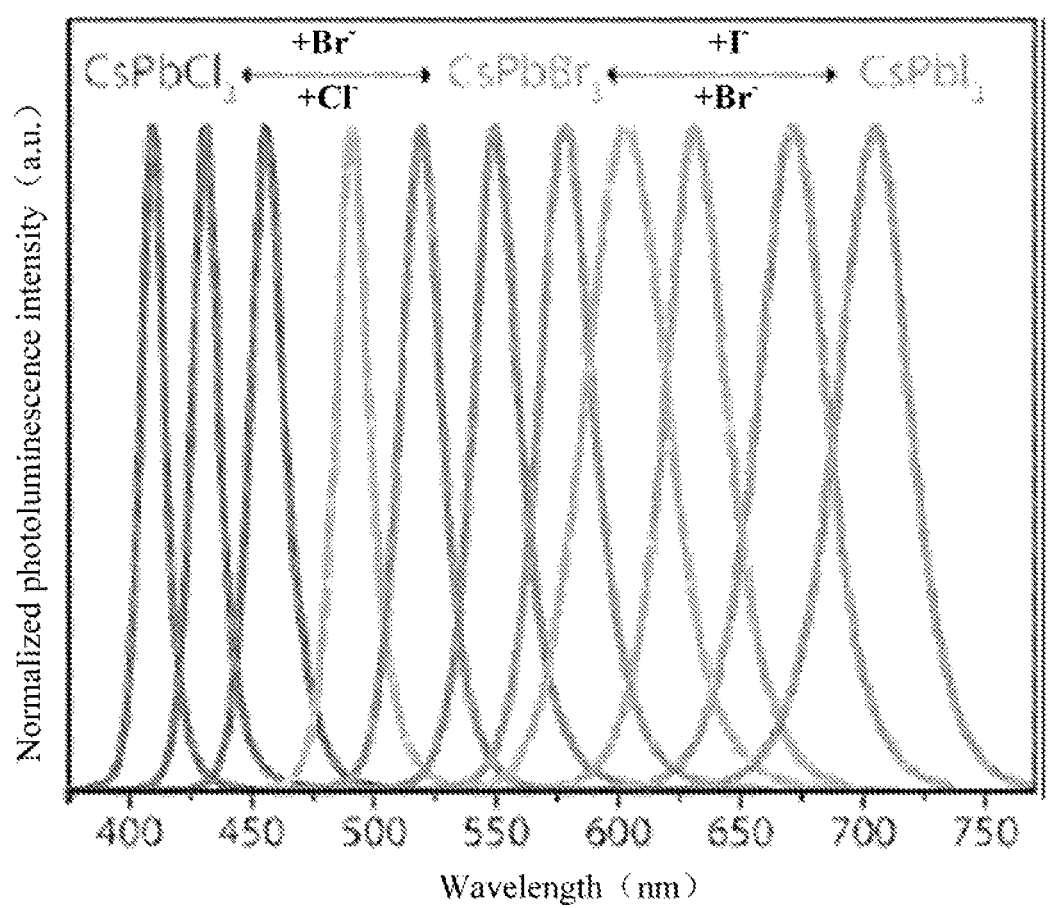
FIG. 5 shows dependence of the emission wavelength on the ratio of $Cl^-/Br^-$ and $Br^-/I^-$ in cesium lead halide perovskites ($CsPbX_3$).

When metal halide perovskites are synthesized as monodisperse colloidal nanocubes with 5-15 nm edge lengths, their optical properties are easily tunable over the entire visible spectral region (410-700 nm) and depend on the halide composition (X=Cl, Br, and I, or a mixed system Cl/Br and Br/I). FIG. 5 shows dependence of the emission wavelength and normalized photoluminescence intensity on the ratio of Cl$^-$/Br$^-$ and Br$^-$/I$^-$ in metal halide perovskites using cesium lead halide perovskites (CsPbX$_3$) as an example.

A metal halide perovskite layer can be fabricated either from pre-synthesized colloidal dispersion of perovskite nanocrystals (NCs) via spin-coating, ink-jet printing, nozzle printing, offset printing, slot-coating, spraying or other methods or it can be directly formed on the prepared substrate or a display substrate from the precursors using sol-gel, ligand assisted reprecipitation (LARP) or other methods.

Embodiments of the present disclosure provide a clear advantage over the existing methods of patterning metal halide perovskite emitting material layer by techniques such as ink-jet printing and conventional micro-printing. The present disclosure may result in a very precise high resolution pattern with clearly defined edges with very high film thickness uniformity. While both ink-jet printing and conventional micro-contact printing struggle with high resolution patterns due to some inherent disadvantages, such as machine limitations, ink properties and drying conditions for ink-jet printing, or flexible stamps for conventional micro-contact printing, the present disclosure using post-synthetic halide exchange can provide a reliable option of creating high resolution pattern with nearly identical crystalline structure of the emitting layer regardless of the emitted color.

In some embodiments of the present disclosure, a method of forming a metal halide perovskite emitting pattern of a metal halide perovskite electro-luminescence display is provided. The method may include preparing a display substrate, forming a metal halide perovskite layer on the display substrate, patterning a metal halide perovskite layer using post-synthetic halide exchange in the designated areas of the metal halide perovskite layer to form a plurality of the red, green and blue emitting areas corresponding to red, green and blue subpixels of the metal halide perovskite electro-luminescence display.

The metal first halide perovskite may be an all inorganic metal first halide perovskite or a hybrid organic-inorganic metal first halide perovskite. In one embodiment, the metal first halide perovskite includes metal Cs. In one embodiment, the metal first halide perovskite is cesium lead first halide perovskite.

Another example of the present disclosure is a metal halide perovskite light emitting display apparatus comprising the light emitting layer formed by the method according to one embodiment of the present disclosure.

Another example of the present application is a display apparatus. The display apparatus may include a light emitting layer. The light emitting layer may include a first pattern comprising metal second halide perovskite: a second pattern comprising metal third halide perovskite; and a third pattern comprising metal first halide perovskite. There may be no banks or low banks among the first pattern, the second pattern, and the third pattern. The first halide, the second halide, and the third halide may be iodide, bromide, and chloride respectively.

The principle and the embodiment of the disclosure are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical embodiment is not limited to the specific combination of the technical features, and also should covered other technical embodiments which are formed by combining the technical features or the equivalent features of the technical features without departing from the inventive concept. For example, technical embodiments may be obtained by replacing the features described above as disclosed in this disclosure (but not limited to) with similar features.

What is claimed is:

1. A method of manufacturing a light-emitting layer, the method comprising:
   forming a layer of metal first halide perovskite on a substrate:
   forming a first pattern comprising metal second halide perovskite in the layer of metal first halide perovskite; and
   forming a second pattern comprising metal third halide perovskite in the layer of metal first halide perovskite.

2. The method of claim 1, wherein the first halide is bromide, the second halide is iodide, and the third halide is chloride.

3. The method of claim 2, wherein forming the first pattern comprising metal second halide perovskite in the layer of metal first halide perovskite comprises:
   depositing a solution comprising iodide in a first region on the layer of metal first halide perovskite; and
   performing a first halide conversion to exchange the bromide in the layer of metal first halide perovskite where the first pattern is formed with the iodide in the solution. comprising iodide partially or completely,
   wherein orthographic projection of the first region on the substrate substantially coincides with orthographic projection of the first pattern on the substrate.

4. The method of claim 3, wherein the solution comprising iodide is benzoyl iodide solution in toluene.

5. The method of claim 3, wherein depositing the solution comprising iodide in the first region on the layer of metal first halide perovskite is performed by a screen printing technique using a first screen.

6. The method of claim 2, wherein forming the second pattern comprising metal third halide perovskite in the layer of metal first halide perovskite comprises:
   depositing a solution comprising chloride in a second region on the layer of metal first halide perovskite; and
   performing a second halide conversion to exchange the bromide in the layer of metal first halide perovskite where the second pattern is formed with the chloride in the solution comprising chloride partially or completely,
   wherein orthographic projection of the second region on the substrate substantially coincides with orthographic projection of the second pattern on the substrate.

7. The method of claim 6, wherein the solution comprising chloride is benzoyl chloride solution in toluene.

8. The method of claim 7, Wherein depositing the solution comprising chloride in the second region on the layer of metal first halide perovskite is performed by a screen printing technique using a second screen.

9. The method of claim 1, wherein the first halide is iodide, the second halide is bromide, and the third halide is chloride.

10. The method of claim 9, wherein forming the first pattern comprising metal second halide perovskite in the layer of metal first halide perovskite comprises:
    applying a first gas comprising bromine in a first region on the layer of metal first halide perovskite to perform a first halide conversion;
    wherein orthographic projection of the first region on the substrate substantially coincides with orthographic projection of the first pattern on the substrate; and
    the iodide in the layer of metal first halide perovskite where the first pattern is formed is exchanged with the bromine in the first gas to form the first pattern comprising metal second halide perovskite.

11. The method of claim 10, wherein forming the second pattern comprising metal third halide perovskite in the layer of metal first halide perovskite comprises:
    applying a second gas comprising chlorine in a second region on the layer of metal first halide perovskite to perform a second halide conversion;
    wherein orthographic projection of the second region on the substrate substantially coincides with orthographic projection of the second pattern on the substrate; and
    the iodide in the layer of metal first halide perovskite where the second pattern is formed is exchanged with the chlorine in the second gas to form the second pattern comprising metal third halide perovskite.

12. The method of claim 11, wherein the second gas comprising chlorine is a chlorine gas or a mixture of chlorine and bromine gases.

13. The method of claim 9, wherein forming the first pattern comprising metal second halide perovskite in the layer of metal first halide perovskite comprises:

performing a first irradiation on a third region of the layer of metal first halide perovskite to form a third pattern comprising metal first halide perovskites with partially graphitized ligands in the layer of metal first halide perovskite; and applying a first gas comprising bromine on the layer of metal first halide perovskite to perform a first halide conversion so that the iodide in the layer of metal first halide perovskite except the third pattern is exchanged with the bromine in the first gas partially or completely to form a layer of metal second halide perovskite;

performing a second irradiation on a first region of the layer of metal second halide perovskite to form the first pattern comprising metal second halide perovskite with partially graphitized ligands in the layer of metal second halide perovskite;

wherein orthographic projection of the third region on the substrate substantially coincides with orthographic projection of the third pattern on the substrate; and orthographic projection of the first region on the substrate substantially coincides with orthographic projection of the first pattern on the substrate.

14. The method of claim 13, wherein forming the second pattern comprising metal third halide perovskite in the layer of metal first halide perovskite comprises:

applying a second gas comprising chlorine on the layer of metal second halide perovskite to perform a second halide conversion;

wherein the bromide in the layer of metal second halide perovskite except the first pattern is exchanged with the second gas to form the second pattern comprising metal third halide perovskite.

15. The method of claim 13, wherein the first irradiation is an x-ray irradiation or an e-beam irradiation, and the second irradiation is an x-ray irradiation or an e-beam irradiation.

16. The method of any one of claims 1, wherein the metal first halide perovskite is an all inorganic metal first halide perovskite or a hybrid, organic-inorganic metal first halide perovskite.

17. The method of any one of claim 1, wherein the metal first halide perovskite comprises metal Cs.

18. The method of any one of claim 1, wherein the metal first halide perovskite is cesium lead first halide perovskite.

19. A metal halide perovskite light emitting display apparatus comprising the light emitting layer formed by the method of claim 1.

\* \* \* \* \*